United States Patent [19]
Lippens et al.

[11] Patent Number: 5,432,362
[45] Date of Patent: Jul. 11, 1995

[54] RESONANT TUNNEL EFFECT QUANTUM WELL TRANSISTOR

[75] Inventors: Didier Lippens, Villeneuve D'Ascq; Borge Vinter, Paris, both of France

[73] Assignee: Thomson-CSF, Puteaux, France

[21] Appl. No.: 180,795

[22] Filed: Jan. 10, 1994

Related U.S. Application Data

[63] Continuation of Ser. No. 983,393, Nov. 30, 1992, abandoned.

[30] Foreign Application Priority Data

Dec. 10, 1991 [FR] France .................. 91 15270

[51] Int. Cl.⁶ .............................................. H01L 49/02
[52] U.S. Cl. .................................. 257/197; 257/14; 257/15; 257/17; 257/183
[58] Field of Search ............. 257/28, 14, 197, 15, 257/21, 189, 25, 9, 11, 12, 17, 183, 198

[56] References Cited

U.S. PATENT DOCUMENTS

| | | | |
|---|---|---|---|
| 4,617,724 | 10/1986 | Yokoyama et al. | 257/197 |
| 4,722,907 | 2/1988 | Wail et al. | 437/3 |
| 4,806,998 | 2/1989 | Vinter et al. | 357/22 |
| 4,907,042 | 3/1990 | Tardella et al. | 357/16 |
| 5,012,301 | 4/1991 | Xu et al. | 257/14 |
| 5,070,375 | 12/1991 | Sakai | 257/189 |
| 5,086,327 | 2/1992 | Rosencher et al. | 357/30 |
| 5,093,699 | 3/1992 | Weichold et al. | 257/24 |

FOREIGN PATENT DOCUMENTS 253174 1/1988 European Pat. Off.

OTHER PUBLICATIONS

Reed, et al., Physical Review Letters, vol. 60, No. 6, 1988, pp. 535–537. "Observation of Discrete Electronic States in a Zero-Dimensional Semiconductor Nanostructure".

Groshev, et al., Physical Review Letters, vol. 66, No. 8, 1991, pp. 1082–1085. "Charging Effects of a Single Quantum Level in a Box".

*Primary Examiner*—Jerome Jackson
*Assistant Examiner*—Alice W. Tang
*Attorney, Agent, or Firm*—Oblon, Spivak, McClelland, Maier & Neustadt

[57] ABSTRACT

The invention is a resonant tunnel effect quantum well transistor. To improve the gain by avoiding the storage of charges in the well, which consists of layer (14) with a narrow forbidden band and two barriers (13, 15) with a wide forbidden band, the quantum well is laterally bounded—in the plane of the layers—by a depleted region (22) which forms a quantum box whose dimensions are smaller than the De Broglie wavelength. Application to fast electronics (200 GHz).

6 Claims, 2 Drawing Sheets

RESONANT TUNNEL EFFECT QUANTUM WELL TRANSISTOR

This application is a continuation of application Ser. No. 07/983,393, filed on Nov. 30, 1992, now abandoned.

BACKGROUND OF THE INVENTION

1. Field of the Invention This invention is a quantum well transistor which uses the resonant tunnel effect and possesses a low base current and high gain in the microwave range (several tens of gigahertz).

2. Discussion of the Background

In a semiconductor device, a quantum well is formed by a double barrier, or double heterojunction structure—consequently a structure in the body of the device—in which the well layer is very fine (1–20 nm) and has a narrow forbidden band, the two barrier layers having a wide forbidden band. For charge carriers, for example, conduction electrons, the potential energy configuration forms a well. The most favorable energy levels occur when the electrons are in the well. The well layer itself is sufficiently thin to generate quantum phenomena, hence the name "quantum well".

It is known that filtering an electron flow in quantum well structures between two ohmic contacts gives highly non-linear current-voltage characteristics. The most spectacular example is the double-barrier resonant tunnel effect diode which has a negative differential resistance coefficient at ambient temperature. Active non-linear components offering a fast response are important in analog microwave applications and ultra-fast multi-state digital applications.

Although constructive interference effects based on resonant effects can be attained in a simple diode, a third control electrode facilitates the development of applications. It would appear preferable to apply control directly in the well: this will allow the development of components in which physical phenomena occur virtually instantaneously and which are highly sensitive to voltage.

Several types of quantum well transistors are known to the prior art, including some which use a resonant tunnel effect to allow carrier injection. In these transistors, the layer of semiconductor material which forms the quantum well is not bounded laterally, i.e. in the direction in which the material grows, and the layer spreads under the lateral metallizations which form the base (if the structure is vertical). Charge carriers injected by the tunnel effect from the emitter through the first barrier and the base are only collected if they have sufficient energy to cross the second barrier in the quantum well at the collector level; other charge carriers become thermal in the base and dissipate their energy.

Consequently, while certain high-energy electrons can cross the barrier to the collector, other electrons, with lower energy levels, remain in the well, since they are incapable of crossing the second barrier; they escape laterally via the base metallization, increasing the base current and reducing the transistor gain.

SUMMARY OF THE INVENTION

The aim of the invention is to prevent electrons in a resonant tunnel effect transistor from changing their energy level in the base, to obtain a transistor with a low base current and a high gain and cut-off frequency. This aim is achieved by limiting the lateral dimensions of the layers of semiconductor material which form the quantum well to induce lateral quantization phenomena, these phenomena already occurring perpendicular to the plane of those of the said layers. It seems that the energy levels, known as sub-bands, then subdivide, by quantization, into discrete states: relaxation between discrete states is more difficult than inter-sub-band relaxation since an electron can only relax by emitting a phonon if the energy of the phonon is equal to the energy difference between the two states. If electrons cannot relax in the quantum well, their energy level becomes sufficiently high to allow them to cross the second well barrier to the collector, thus reducing the base current and increasing the transistor gain.

Reducing the lateral dimensions of the quantum well is not a simple geometric step to allow higher scale integration of integrated circuits. It is a physical measure which engenders quantum phenomena and encloses part of the quantum well layers in a quantum box in which the movement of carriers is quantized in all three directions and not only in the direction of the depth of the well.

More precisely, the invention is a resonant tunnel effect quantum-well transistor containing at least one quantum well formed by a layer of semiconductor material with a narrow forbidden band situated between barriers, consisting of two layers of semiconductor material with a wide forbidden band, the layers being thin so that quantization occurs in the direction of layer growth, in which the quantum well is laterally bounded, in the planes of the said layers, by a depletion zone which forms a quantum box whose lateral dimensions are less than the De Broglie wavelength.

BRIEF DESCRIPTION OF THE DRAWINGS

The invention will be better understood upon treading the following detailed description of an embodiment, referring to the appended figures of which.

MORE DETAILED DESCRIPTION

Figure 1:
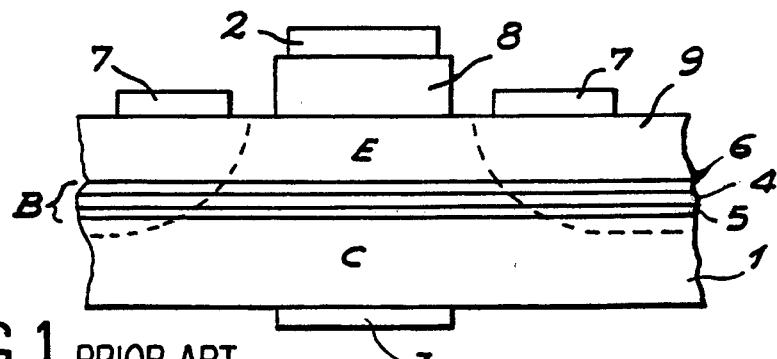
FIG. 1 is a simplified section on a resonant tunnel transistor complying with the prior art.

FIG. 1 schematizes the structure of a quantum well transistor to assist in understanding the subsequent description of the invention. Due to the dimensions of the quantum well, the structure is mandatorily vertical and the thicknesses are controlled by controlling the time during which the semiconductor material layers grow.

In a quantum well transistor, supported by a substrate 1, the flow of current from an emitter electrode 2 (or source) to a collector electrode 3 (or drain) is controlled by a series of fine layers 4+5+6 which form a quantum well, itself controlled by the base (or gate) electrode 7, generally deposited around a mesa 8 which carries the emitter metallization 2. A region 9 separates the quantum well from the metallizations 2 and 7. Obviously, layers 1, 9 and 8 can also include sub-layers with doping gradients, for smoothing, contacts, etc. but these are not represented because they are not required to understand the operation.

In the prior art, there is no boundary, in the plane of the layers, to quantum wells 4+5+6. In other words, in the prior state of the masking art, the lateral dimensions of a known quantum well are at least one or two microns, which is very large.

The materials used in this transistor are, preferably, group III-V materials such as GaAs, AlGaAs, InP... etc., and the forbidden band of the central layer 4 is narrower than that of barrier layers 5 and 6 and, in certain prior art proposals, also narrower than that of emitter regions 8+9 and collector region 1, which have a wide forbidden band.

Quantum phenomena occur whenever at least one dimension in a structure is shorter than the De Bfoglie wavelength. In a quantum well, the narrow forbidden band of layer 4, whose thickness is less than 20 nm, ensures the electrons see a potential energy in the form of a well and their most favorable energy level is that when they are in this well. Because the wave function can only weakly penetrate barrier materials 5 and 6—due to the quantum mechanics tunnel effect—it can be assumed, as a first approximation, that the electron wave function is eliminated at the two well interfaces. In this case, the wave functions which represent the solutions to the Schrodinger equation for movement perpendicular to the layers, become discrete quantized functions. Consequently, since the electron energy levels depend on the wave functions, the energy corresponding to movement in the growth direction, i.e. perpendicular to the layers, also quantized. The movement of the electrons parallel to the layers, i.e. across the transistor—is unaffected by quantization. It is the two-dimensional movement of free particles with two degrees of freedom.

Figure 2:
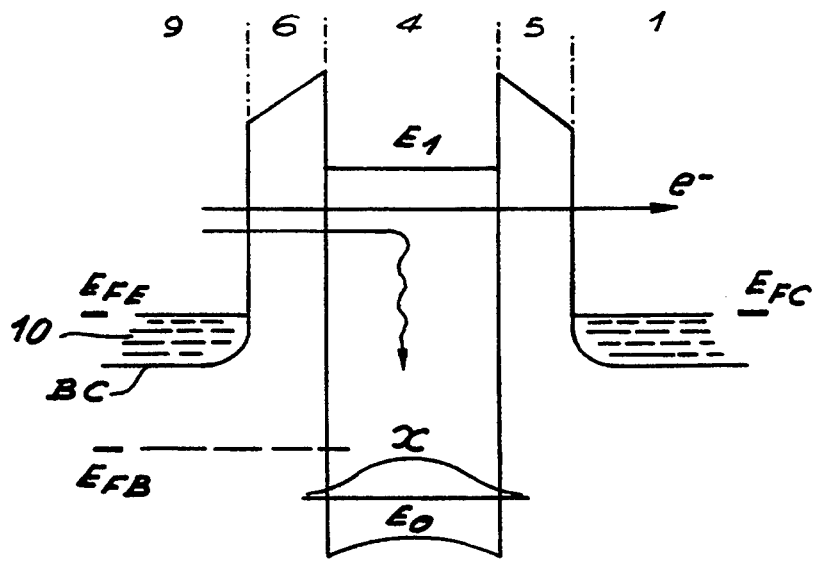
FIG. 2 is a diagram of the wave bands in a quantum well.

This will be more easily understood by referring to FIG. 2, which shows the conduction band of a resonant tunnel effect transistor with an embedded quantum well. The figure uses the same suffices as FIG. 1 to represent the layers of material in the device. Axis z is the direction in which the layers grow.

Barriers 5 and 6 consist of a semiconductor material, for example, AlGaAs, whose forbidden band is wide compared to that of the material, for example GaAs, in the emitter and collector regions 9 and 1. The material in well 4, for example InGaAs, has a narrower forbidden band than the other materials. The well is sufficiently deep and wide (5 to 20 nm along axis z) to ensure the fundamental energy level $E_O$ is in the emitter conductive band BC.

By selecting the well width, it is possible to concentrate the electrons solely in the fundamental level $E_0$, in a "bonded" state.

It is possible, using an ohmic contact on the base, which acts as an "electron tank" to vary the surface density of charges $n_s$ situated in the well. By varying voltage $V_{BE}$ across the base and emitter, it is possible to vary the difference between the Fermi levels $E_{FE}$ in the emitter and $E_{FB}$ in the base. Because the charge situated at fundamental level $E_O$ depends directly on difference $E_{FB} - E_O$, $V_{BE}$ can be used to modulate the surface density $n_s$. This affects the band distribution in the well and, therefore, the position of the excited level $E_1$ to ensure conduction, relative to the levels in the emitter (at 10), population which are, at the first approximation, below the emitter Fermi level $E_{FE}$. The relationship between $E_{FE}$ (fixed) and the level of $E_1$ varies, making it possible to modulate the tunnel current between the emitter and the collector represented, in FIG. 2, by an electron $e^-$ crossing barriers 5 and 6.

In practice, a non-negligible fraction of the careers injected into the well relax to the fundamental level $E_O$ very quickly. They are, therefore, situated at the fundamental level $E_O$ and thus do not allow the transistor to operate since the resultant emitter-base current reduces the transistor gain. It is known that heterostructure transistors have a disadvantage in that their performance is poor at ambient temperature: since the differential energy level across a barrier $\Delta E_c$ is low (300 meV) compared to the Shottky barrier (600–800 meV), MOS interfaces (3 eV) or the forbidden bands in silicon or GaAs, the leak currents are very high.

Figure 3:
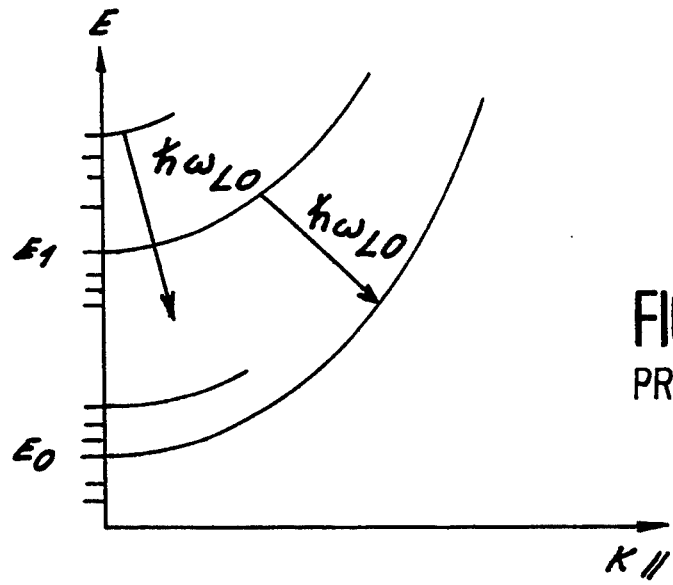
FIG. 3 is a diagram of energy levels against parallel movement in a quantum well.

The time to relax from excited level $E_I$ to fundamental level $E_0$ is comparable to the life, due to the tunnel effect, of quasi-bonded state $E_1$. The relative ease with which carriers relax from $E_1$ to $E_0$ can be understood from FIG. 3 which plots energy level E against electron movement K// parallel to the surfaces of the quantum well, i.e. laterally in the case of a transistor.

For a quantum well with infinite potential, consisting of layers whose areas are not bounded. The free movements of electrons in the two directions parallel to the barriers creates a continuum of energy sub-band states: an electron can easily emit an optical phonon with energy $h\omega_{10}$ (h=Planck's constant/$2\pi$, $\omega$=angular velocity), causing a transition to lower energy levels and relaxing from quasi-bound band $E_1$ to bound band $E_0$. This relaxation is made possible by the fact that, since the well is not quantized in the two directions parallel to the barriers, there are only energy bands such as $E_0$ and $E_1$ and the phonon energy corresponds to the difference between two bands.

The same is not true for a quantum box transistor complying with the invention, in which the quantum well layers are laterally bounded, limiting them to dimensions smaller than the De Broglie wavelength. The loss of degrees of freedom in directions other than the direction in which the layers grow results in quantization into discrete states in the lateral direction, leading to discrete energy levels. If the space between two levels does not represent the energy of a phonon, no transition between these two levels is possible. Consequently, less electrons are situated in the well, the base current is less and the gain is higher.

Figure 4:
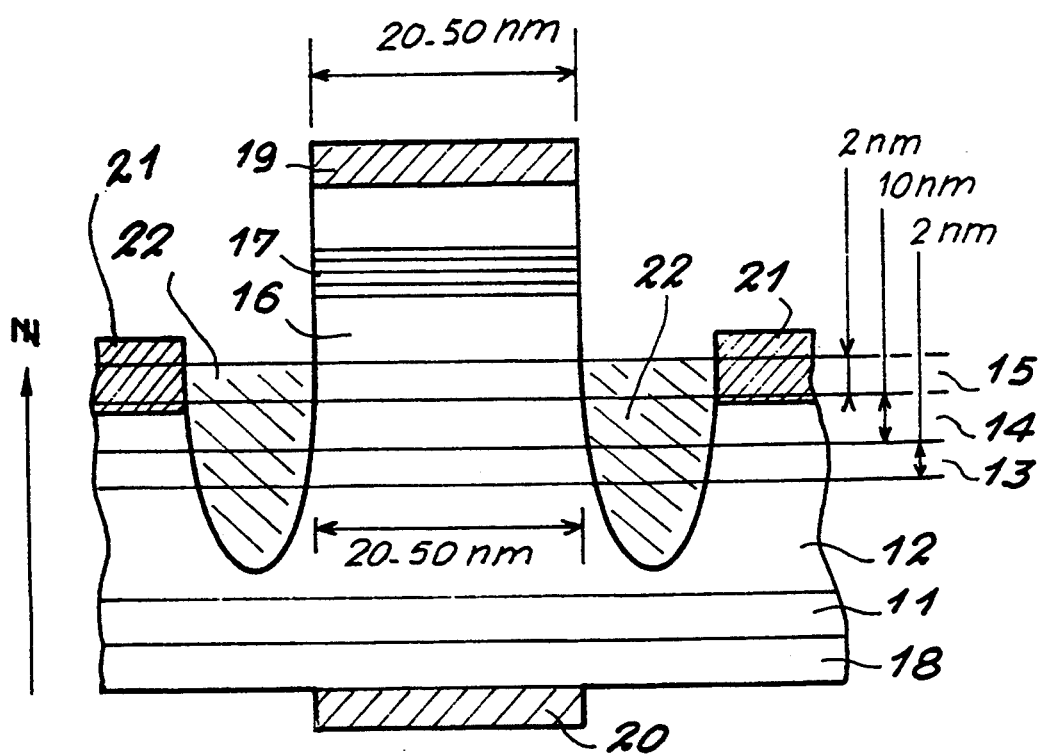
FIG. 4 is a simplified section on a quantum box transistor complying with the invention.

FIG. 4 is a schematic cross-section on a quantum transistor complying with the invention. This transistor comprises a series of layers supported by a substrate 11 in III-V doped materials such as GaAs, the growth of these layers (direction z) being carefully controlled and the layers comprising:
- a spacer 12, 30–50 nm thick, in GaAs which is either undoped or doped to the lightly N-type.
- a first barrier 13, 2 nm thick, in undoped $Al_xGa_{1-x}As$.
- a quantum well 14, 10 nm thick, in undoped $Ga_yIn_{1-y}As$, where y=0.85.
- a second barrier 15 identical to the first barrier.
- a spacer 16 identical to spacer 12.
- an emitting mesa 17 in n+-doped GaAs, possible produced by planar doping by implantation of Si ions during growth.
- a collector contact 18 in n+-doped GaAs on the rear face of substrate 11.

Techniques, known to the prior art and not detailed here, are then used to etch a mesa on emitter contact layers 16 and 17. The lateral dimension of this mesa, parallel to the planes of the layers, is between 20 and 50 nm. An emitter metallization 19 is then deposited on the mesa and a collector metallization 20 is deposited on collector contact 18. A non-alloyed base metallization 21 is then deposited at the bottom of the mesa; this metallization is kept thin to avoid short-circuiting quantum well 14: the distance between the base contact 21 and mesa 16+17 is approximately the depth of the quantum well 13+14+15, i.e. in this example, 14 nm. The electrons are laterally confined in layer 14 between the two barriers 13 and 15 by the pre-surface potential between the mesa and contact 21.

When voltages are applied to the metallizations 19 and 21, a depletion zone 22 forms at the bottom of the mesa and encloses part of quantum well 13+14+15 forming a "quantum box" whose lateral dimensions, parallel to the layer planes, are less than the De Broglie wavelengths.

In real terms, the difference between energy levels $E_0$ and $E_1$ depends on the lateral dimensions of the box. i.e. the width of the potential which laterally confines the electrons: this width is approximately 20 nm for a phonon energy of 36 meV. With AlGa As barriers, 1.7 nm thick and a 10 nm-deep well in $Ga_{1-y}In_y$ As (y=0.85), the well bottom is approx. 150 meV below the bottom of the conduction band: for a 10 nm-deep well, this offset is sufficient to totally confine the fundamental $E_0$ and make transitions between $E_1$ and $E_0$ impossible since the space between these two levels exceeds $\hbar\omega_{10}$. Due to its small size, a transistor complying with the invention must be vertical: this is the only possible means of accurately controlling distances such as 1.7 nm. This means that the ohmic base contact 21, which is deposited directly on quantum well barrier 15 must be only lightly diffused to avoid short-circuiting the base and collector layers.

As described in the operating principal above, the transistor effect is obtained by modulating the space charge situated in the well which, by reacting with the space charge, modifies level $E_1$. The quantum well transistor complying with the invention operates at frequencies of up to 200 GHz and, consequently, finds applications in high-speed electronics.

What is claimed is:

1. A resonant tunnel effect quantum well transistor, comprising:

a layer of semiconductor material with a narrow forbidden band;

a first barrier layer with a wide forbidden band formed on a first side of the layer of semiconductor material;

a second barrier layer with a wide forbidden band formed on a second side of the layer of semiconductor material;

an emitter means formed in an emitter region on the first side of the layer of semiconductor material;

a base metallization formed in a base region on the first side of the layer of semiconductor material;

wherein the layer of semiconductor material and the first and second barrier layers are laterally bounded by a depletion zone formed between the emitter region and base region which extends through the layer of semiconductor material and the first and second barrier layers and which forms a quantum box with a lateral dimension less than a De Broglie wavelength.

2. The resonant tunnel effect transistor according to claim 1, wherein the layer of semiconductor material is formed of $Ga_yIn_{1-y}As$, where $0<y<1$, and the first and second barrier layers are each formed of $Al_xGa_{1-x}As$, where $0<x<1$.

3. The resonant tunnel effect transistor according to claim 1, wherein the layer of semiconductor material has a thickness of 10 nm and the first and second barrier layers each have a thickness of 2 nm.

4. The resonant tunnel effect transistor according to claim 3, wherein the layer of semiconductor material is formed of $Ga_yIn_{1-y}As$, where $0<y<1$, and the first and second barrier layers are each formed of $Al_xGa_{1-x}As$, where $0<x<1$.

5. The resonant tunnel effect transistor according to claim 1, further comprising:

a first spacer layer formed next to the first barrier layer;

a second spacer layer formed next to the second barrier layer;

a substrate formed next to the first space layer;

a collector formed next to the substrate;

the emitter means being formed next to the second spacer layer; and the base metallization being formed next to the quantum box.

6. The resonant tunnel effect transistor according to claim 5, wherein the first and second spacer layers are each formed of GaAs.

* * * * *